United States Patent
Rossberg et al.

(10) Patent No.: US 9,774,320 B2
(45) Date of Patent: Sep. 26, 2017

(54) ELECTRONIC DRIVE CIRCUIT

(71) Applicant: Infineon Technologies Austria AG, Villach (AT)

(72) Inventors: Andre Rossberg, Villach (AT); Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/055,079

(22) Filed: Feb. 26, 2016

(65) Prior Publication Data

US 2016/0254810 A1 Sep. 1, 2016

(30) Foreign Application Priority Data

Feb. 27, 2015 (DE) .......................... 10 2015 102 878

(51) Int. Cl.
*H03K 3/00* (2006.01)
*H03K 17/042* (2006.01)

(52) U.S. Cl.
CPC .............................. *H03K 17/04206* (2013.01)

(58) Field of Classification Search
None
See application file for complete search history.

(56) References Cited

U.S. PATENT DOCUMENTS

| | | | | |
|---|---|---|---|---|
| 5,239,237 A | * | 8/1993 | Tran ......................... | G11C 7/22 365/189.05 |
| 6,362,678 B1 | * | 3/2002 | Bosnyak ............ | H03K 19/0136 327/112 |
| 2001/0015670 A1 | * | 8/2001 | Sakai ..................... | H02M 1/08 327/434 |
| 2015/0116006 A1 | * | 4/2015 | Ferianz .................. | H03K 17/04 327/109 |

* cited by examiner

*Primary Examiner* — Long Nguyen
(74) *Attorney, Agent, or Firm* — Murphy, Bilak & Homiller, PLLC (57) ABSTRACT

An electronic circuit includes an input configured to receive an input signal and an output configured to be coupled to load, an output transistor including a load path and a control node, the load path being connected between the output and a first supply node, a drive transistor including a load path and a control node, the load path being connected to the control node of the output transistor, a first electronic switch connected in series with the load path of the drive transistor, a biasing circuit including an internal impedance and connected between the control node of the drive transistor and the first supply node, and a control circuit configured to receive the input signal and to drive the first electronic switch based on the input signal.

20 Claims, 5 Drawing Sheets

ELECTRONIC DRIVE CIRCUIT

PRIORITY CLAIM

This application claims priority to German Patent Application No. 10 2015 102 878.6 filed on 27 Feb. 2015, the content of the application incorporated herein by reference in its entirety.

TECHNICAL FIELD

Embodiments of the present invention relate to an electronic circuit, in particular an electronic drive circuit for driving a capacitive load such as, for example, the gate of a transistor.

BACKGROUND

MOS transistors such as MOSFETs (Metal Oxide Semiconductor Field-Effect Transistors) or IGBTs (Insulated Gate Bipolar Transistors) are widely used in automotive, industrial, or consumer electronic applications for driving loads, converting power, or the like. MOS transistors are voltage controlled devices that include an internal capacitance (often referred to as gate-source capacitance) formed by a gate electrode, a gate dielectric and body and source regions. The MOS transistor can be switched on and off by charging and discharging the internal capacitance, wherein switching on includes one of charging and discharging the internal capacitance, and switching off includes the other one of charging and discharging the internal capacitance. For example, in an enhancement type MOS transistor, switching on the MOS transistor includes charging the internal capacitance and switching off the MOS transistor includes discharging the internal capacitance.

Modern MOS transistors for switching electrical loads may have a voltage blocking capability of several 10V up to several 100V but may be designed to withstand voltages of only several volts, such as less than 5V or even less than 3V at their internal capacitance (at the gate node). Furthermore, it is desirable to switch those MOS transistors at high frequency, that is, to charge and discharge the internal capacitance at a high rate.

There is therefore a need for an electronic drive circuit that is capable of driving a capacitive load at a high frequency without exceeding a predefined voltage threshold across the capacitive load.

SUMMARY

One embodiment relates to an electronic circuit. The electronic circuit includes an input configured to receive an input signal and an output configured to be coupled to load, an output transistor having a load path and a control node, wherein the load path is connected between the output and a first supply node, and a drive transistor having a load path and a control node, wherein the load path is connected to the control node of the output transistor. A first electronic switch is connected in series with the load path of the drive transistor. A biasing circuit having an internal impedance is connected between the control node of the drive transistor and the first supply node. The electronic circuit further includes a control circuit configured to receive the input signal and to drive the first electronic switch based on the input signal.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
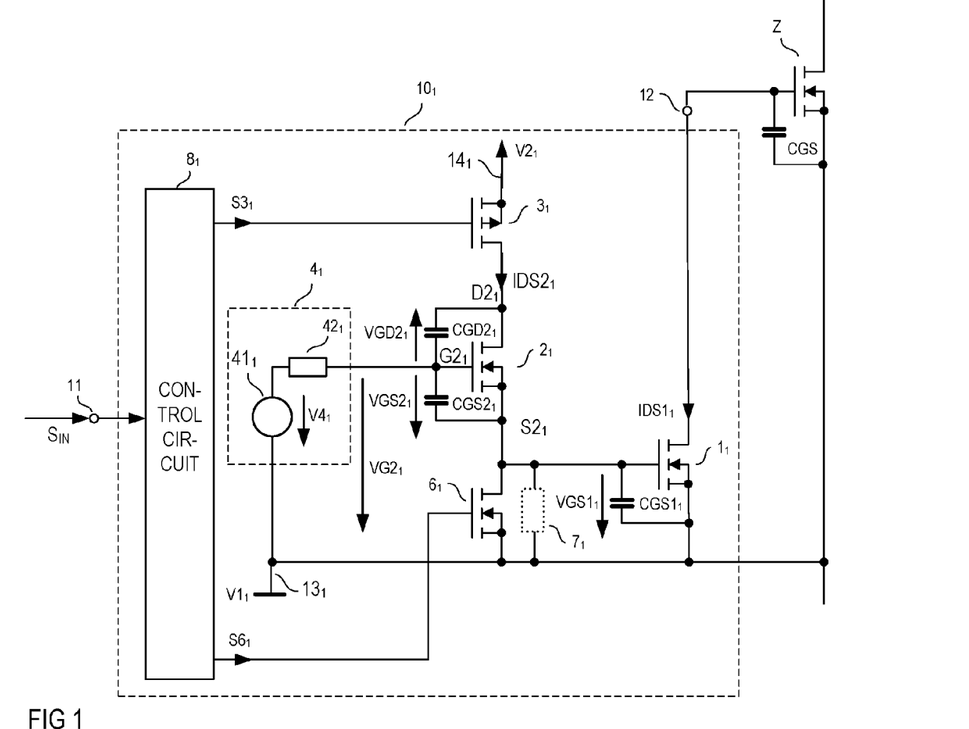
FIG. 1 shows an electronic drive circuit according to one embodiment.

FIG. 1 shows an electronic drive circuit according to one embodiment. This electronic drive circuit is configured to drive a load. In particular, the electronic drive circuit is configured to drive a capacitive load. For example, the capacitive load is an MOS transistor. An MOS transistor, such as a MOSFET or an IGBT, is a voltage controlled semiconductor device that switches on or off dependent on a charging state of an internal gate-source capacitance. Just for the purpose of illustration, FIG. 1 shows a capacitive load Z implemented as a MOSFET, in particular, an n-type enhancement MOSFET. However, this is only an example. Any other type of MOS-transistor may be driven by the electronic drive circuit as well. The internal gate-source capacitance of this MOSFET is represented by a capacitor CGS connected between a gate node G and a source node S of the MOSFET Z.

Referring to FIG. 1, the electronic drive circuit includes an input 11 configured to receive an input signal $S_{IN}$ and an output 12 configured to be coupled to a load Z. In case the load Z is a MOSFET (as shown in FIG. 1) the output 12 of the electronic drive circuit is connected to the gate node of the MOSFET.

The electronic drive circuit further includes an output transistor $1_1$, a drive transistor $2_1$, and a first electronic switch $3_1$. The output transistor $1_1$ includes a load path connected between the output 12 and a first supply node $13_1$, and a control node. The drive transistor $2_1$ includes a control node, and a load path connected to the control node of the output transistor $1_1$ and connected in series with the first electronic switch $3_1$. The first electronic switch $3_1$ is connected between a second supply node $14_1$ and the load path of the drive transistor $2_1$.

The electronic circuit may include a second electronic switch $6_1$ connected between the control node of the output transistor $1_1$ and the first supply node $13_1$. Optionally, a resistor $7_1$ (illustrated in dashed lines in FIG. 1) is connected in parallel with the second electronic switch $6_1$ and, therefore, between the control node of the output transistor $1_1$ and the first supply node $13_1$.

A biasing circuit $4_1$ is connected between the control node of the drive transistor $2_1$ and the first supply node $13_1$. The biasing circuit $4_1$ includes a voltage source $41_1$ configured to provide a biasing voltage $V4_1$, and an internal impedance $42_1$. The biasing circuit $4_1$ is explained in greater detail herein below. A control circuit $5_1$ is configured to receive the input signal $S_{IN}$ and to drive the first electronic switch $3_1$ and the second electronic switch $6_1$ based on the input signal $S_{IN}$.

The circuit elements explained above, that is, the output transistor $1_1$, the drive transistor $2_1$, the first electronic switch $3_1$, the biasing circuit $4_1$, the control circuit $5_1$, the second electronic switch $6_1$, and the optional resistor $7_1$ are part of a first drive circuit $10_1$, which will briefly be referred to as first driver or low-side driver in the following. This first driver $10_1$ is configured to discharge a capacitive load coupled to the output 12. If, as shown in FIG. 1, the load Z is an enhancement MOSFET and has its gate node coupled to the output 12 the capacitive load is the internal gate-source capacitance CGS of the MOSFET. Discharging this internal capacitance CGS by the first driver $10_1$ is equivalent to switching of the MOSFET Z. Thus, if the load Z driven by the electronic drive circuit is an MOS transistor the first driver $10_1$ is configured to switch off the MOS transistor. Besides the first driver $10_1$ configured to discharge a capacitive load (switch off an MOS transistor) the electronic circuit may include a second driver (not shown in FIG. 1) configured to charge the capacitive load (switch on the MOS transistor).

The first driver $10_1$ discharges the capacitive load CGS (switches off the MOS transistor Z) when the output transistor $1_1$ is in an on-state (is switched on). In the on-state, the output transistor $1_1$ electrically connects the output 12 with the first supply node $13_1$. In operation of the first driver $10_1$, the first supply $13_1$ may be connected to a load terminal of the capacitive load CGS facing away from the output 12 so that the load path of the output transistor $10_1$ is connected in parallel with the capacitive load CGS.

In general, the operation state of the output transistor $1_1$ is dependent on operation states of the first electronic switch $3_1$ and the second electronic switch $6_1$, respectively. The output transistor $1_1$ is driven in the on-state when the first electronic switch $3_1$ switches on and the second electronic switch $6_1$ switches off, and the output transistor $1_1$ is driven in the off-state when the first electronic switch $3_1$ switches off and the second electronic switch $6_1$ switches on. The control circuit $8_1$ is configured to switch the first electronic switch $3_1$ and the second electronic switch $6_1$ based on the input signal $S_{IN}$ such that only one of the first electronic switch $3_1$ and the second electronic switch $6_1$ is switched on at the same time. In order to prevent a current shoot through, that is, an electrically conducting path between the first supply node $13_1$ and the second supply node $14_1$, the control circuit $8_1$ may be configured to drive the first electronic switch $3_1$ and the second electronic switch $6_1$ such that there is a delay time (dead time) between switching off one of the first electronic switch $3_1$ and the second electronic switch $6_1$ and switching on the other one of the first electronic switch $3_1$ and the second electronic switch $6_1$.

Figure 2:
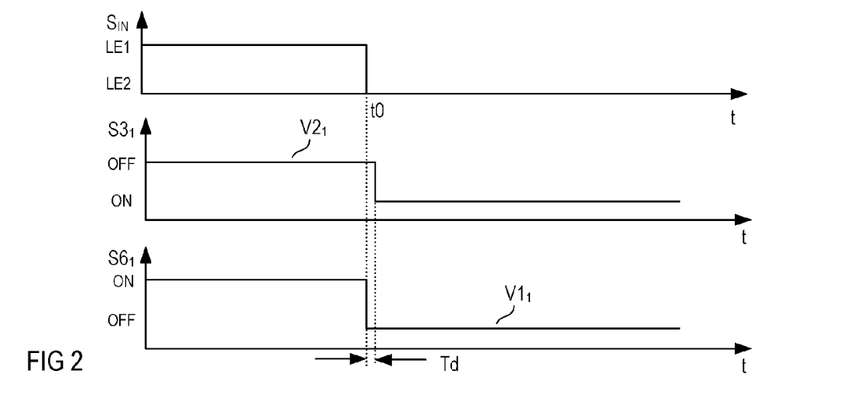
FIG. 2 shows timing diagrams of an input signal and of signals occurring in the electronic drive circuit shown in FIG. 1.

One way of operation of the control circuit $8_1$ is shown in FIG. 2. FIG. 2 shows timing diagrams of the input signal $S_{IN}$, the drive signal $S3_1$ of the first electronic switch $3_1$ and the drive signal $S6_1$ of the second electronic switch $6_1$. The input signal $S_{IN}$ defines the desired operation state of the load Z driven by the electronic switch 10. For the purpose of illustration, it is assumed that the input signal $S_{IN}$ can have one of two different signal levels, namely a first signal LE1 and a second signal level LE2. The first signal level LE1 indicates that it is desired to switch off the output transistor $1_1$, so as to prevent the capacitive load CGS from being discharged, and the second signal level LE2 indicates that it is desired to switch on the output transistor $1_1$, so as to discharge the capacitive load CGS. Just for the purpose of illustration, the first level LE1 is a high-level and the second level LE2 is a low-level in the example shown in FIG. 2.

Each of the drive signals $S3_1$, $S6_1$ can have one of an on-level, which switches on the respective electronic switch $3_1$, $6_1$, and an off-level, which switches off the respective switch $3_1$, $6_1$. When the input signal $S_{IN}$ has the first level LE1 the control circuit $8_1$ switches off the first electronic switch $3_1$ by generating an off-level of the drive signal $S3_1$ and switches on the second electronic switch $6_1$ by generating an on-level of the drive signal $S6_1$. In this operation mode of the first driver $10_1$ the output transistor $1_1$ is switched off. When the signal level of the input signal $S_{IN}$ changes from the first level LE1 to the second level LE2 the control circuit $8_1$ switches off the second electronic switch $6_1$ by generating an off-level of the drive signal $S6_1$ and, after an optional delay time $T_D$, switches on the first electronic switch $3_1$, by generating an on-level of the drive signal $S3_1$. In this operation mode of the first driver $10_1$ the output transistor $1_1$ is switched on.

One way of operation of the first driver $10_1$ shown in FIG. 1 is explained in the following. For the purpose of explanation, it is assumed that each of the output transistor $1_1$ and the drive transistor $2_1$ is an n-type MOSFET, in particular, an n-type enhancement MOSFET. In this case, the control node of the output transistor $1_1$ and the drive transistor $2_1$, respectively, is the gate node of the MOSFET forming the respective transistor, and the load path is the drain-source path of the MOSFET forming the respective transistor. Referring to FIG. 1, the drain node of the MOSFET forming the output transistor $1_1$ (briefly referred to as the drain node of the output transistor $1_1$ in the following) is connected to the output 12, and the source node is connected to the first supply node $13_1$. The source node of the MOSFET forming the drive transistor $2_1$ (briefly referred to as the source node of the drive transistor $2_1$ in the following) is connected to the gate node of the output transistor $1_1$, and the drain node of the drive transistor $2_1$ is connected to the first electronic switch $3_1$.

For the purpose of explanation, it is further assumed that the first electronic switch $3_1$ and the second electronic switch $6_1$ are transistors of complementary conductivity types. In the embodiment shown in FIG. 1, the first electronic switch $3_1$ is a p-type MOSFET, in particular, a p-type enhancement MOSFET, and the second electronic switch $6_1$ is an n-type MOSFET, in particular, an n-type enhancement MOSFET. The MOSFET forming the first electronic switch $3_1$ receives the drive signal $S3_1$ from the control circuit $8_1$ at its gate node. The drain node of this MOSFET forming the first electronic switch $3_1$ is connected to the drain node of the drive transistor $2_1$, and the source node of the MOSFET forming the first electronic switch $3_1$ is connected to the second supply node $14_1$. The MOSFET forming the second electronic switch $6_1$ receives the drive signal $S6_1$ from the control circuit $8_1$ at its gate node. The drain source path of this MOSFET forming the second electronic switch $6_1$ is connected between the gate node of the output transistor $1_1$ and the first supply node $13_1$. That is, the drain-source path of the MOSFET forming the second electronic switch $6_1$ is connected in parallel with an internal gate-source capacitance $CGS1_1$ of the output transistor $1_1$. The output transistor $1_1$ further includes an internal gate-train capacitance. However, this capacitance is not explicitly illustrated in FIG. 1.

The drive transistor $2_1$ includes an internal gate-source capacitance $CGS2_1$ and an internal gate-drain capacitance $CGD2_1$. In FIG. 1, these capacitances are represented by capacitors connected between the gate node and the source node and the drain node, respectively. $VGS2_1$ and $VGD2_1$ denote voltages across these capacitances $CGS2_1$, $CGD2_1$.

If the first electronic switch $3_1$ is implemented as a p-type MOSFET, then, the off-level of the drive signal $S3_1$ may correspond to the level of the electrically potential $V2_1$ at the second supply node $14_1$, while the on-level may be a signal level that is less than the electrically potential $V2_1$ at the second supply node $14_1$ minus the threshold voltage of this p-type MOSFET $3_1$. Those signal levels are shown in FIG. 2. If the second electronic switch $6_1$ is an n-type MOSFET, then the off-level of the drive signal $S6_1$ may correspond to the level of the electrical potential $V1_1$ at the first supply node $13_1$, while the on-level may be a signal level that is higher than the electrical potential $V1_1$ at the first supply node $13_1$ plus the threshold voltage of this n-type MOSFET. These signal levels are also shown in FIG. 2.

An operation mode of the first driver $10_1$ in which the output transistor $1_1$ is switched off will be referred to as off-state of the first driver $10_1$, and an operation mode in which the output transistor $1_1$ is switched on will be referred to as on-state of the first driver $10_1$. There are applications in which it is desirable for the first driver $10_1$ to rapidly switch from the off-state to the on-state, that is, to rapidly switch on the output transistor $1_1$. Switching on the output transistor $1_1$ includes charging the internal gate-source capacitance $CGS1_1$ such that the gate-source voltage $VGS1_1$ across this internal capacitance $CGS1_1$ rises above the threshold voltage of the output transistor $1_1$. In order to rapidly switch on the output transistor $1_1$ it is desirable to rapidly charge the internal gate source capacitance $CGS1_1$ without causing the voltage $VGS1_1$ to exceed a predefined voltage threshold. The drive transistor $2_1$, which has its gate node biased by the biasing circuit $4_1$, is capable of rapidly charging the gate-source capacitance $CGS1_1$ of the output transistor $1_1$. This is explained below.

When the first electronic switch $1_1$ is in the off-state and the gate-source capacitance $CGS1_1$ of the output transistor $1_1$ has been discharged, then the electrical potential at the source node $S2_1$ of the drive transistor $2_1$ corresponds to the electrical potential $V1_1$ at the first supply node $13_1$ so that the gate-source voltage $VGS2_1$ of the drive transistor $2_1$ corresponds to the biasing voltage $V4_1$ provided by the biasing circuit $4_1$. This biasing voltage $V4_1$ is such that it is higher than the threshold voltage of the drive transistor $2_1$ so that the drive transistor $2_1$ is in the on-state. However, a current $IDS2_1$ through the drive transistor $2_1$ is zero until the first electronic switch $3_1$ switches on. Before the first electronic switch $3_1$ switches on, the electrical potential at the drain node $D2_1$ of the drive transistor $2_1$, which is a circuit node between the drive transistor $2_1$ and the first electronic switch $3_1$, substantially corresponds to the electrical potential $V1_1$ at the first supply node $13_1$. Thus, a gate-drain-voltage $VGD2_1$ of the drive transistor $2_1$ also equals the biasing voltage $V4_1$ provided by the biasing circuit $4_1$. In FIG. 1, $VG2_1$ denotes a voltage between the gate node $G2_1$ of the drive transistor $2_1$ and the first supply node $13_1$. This voltage will be referred to as gate voltage in the following. In the steady state, before the first electronic switch $3_1$ switches on, the gate voltage $VG2_1$ substantially equals the biasing voltage $V4_1$.

Figure 3:
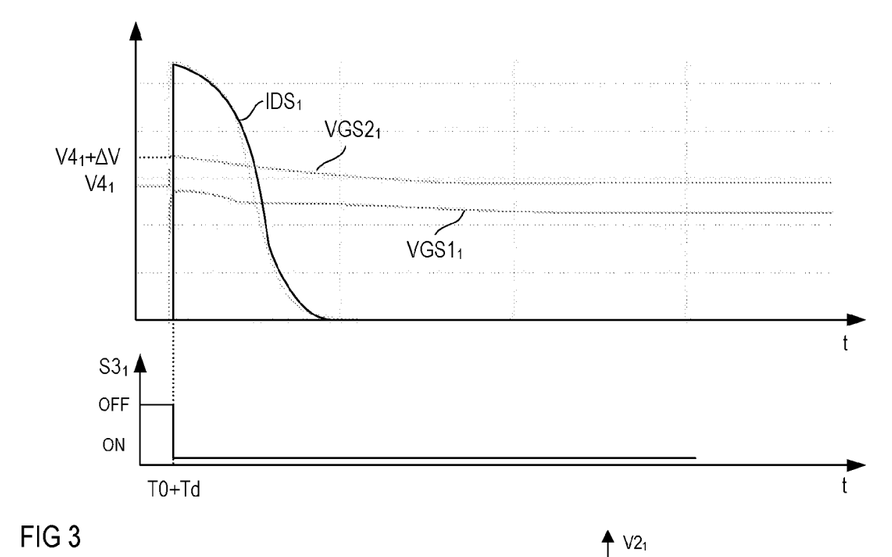
FIG. 3 shows timing diagrams illustrating one way of operation of the electronic drive circuit shown in FIG. 1.

FIG. 3 shows timing diagrams of the drive signal $S3_1$ of the first electronic switch $3_1$, the gate voltage $VG2_1$ of the drive transistor $2_1$, the gate-source voltage $VGS1_1$ of the output transistor $1_1$, and the current $IDS1_1$ through the output transistor $1_1$. The timing diagrams shown in FIG. 3 begin at a time shortly before the electronic switch $3_1$ switches on. Before the first electronic switch $3_1$ switches on, the gate-source voltage $VGS1_1$ of the output transistor $1_1$ is zero, the current $IDS1_1$ (the drain-source current) through the output transistor $1_1$ is zero, and each of the gate voltage $VG2_1$, the gate-source voltage $VGS2_1$, and the gate-drain voltage $VGD2_1$ of the drive transistor $2_1$ substantially equal the biasing voltage $V4_1$.

When the control circuit $8_1$ switches on the first electronic switch $3_1$ based on the input signal $S_{IN}$ the gate-source capacitance $CGS1_1$ of the output transistor $1_1$ is rapidly charged because the drive transistor $2_1$ is already conducting when the first electronic switch $3_1$ switches on. The first electronic switch $3_1$ switches on as soon as the drive signal $S3_1$ reaches the threshold voltage of the MOSFET forming the first electronic switch $3_1$. As soon as the drive signal $S3_1$ reaches the threshold voltage a current $IDS2_1$ with a current level defined by the drive transistor $2_1$ flows through the drive transistor $2_1$ and into a gate-source capacitance $CGS1_1$ of the output transistor $1_1$. A further increase of the signal level between the gate node and the source node of the first electronic switch $3_1$ to above the threshold voltage may reduce the losses occurring in the first electronic switch but does not change the current $IDS2_1$. This is by virtue of the drive transistor $2_1$ being pre-biased by the biasing source $4_1$. The level of the current $IGS2_1$ through the drive transistor $2_1$ is substantially defined by the gate-source voltage $VGS2_1$ of the drive transistor $2_1$.

The current $IGD2_1$ which flows right after the first electronic switch $3_1$ switches on, rapidly charges the gate-source capacitance $CGS1_1$ of the output transistor $1_1$, thus causing a rapidly increasing current $IDS1_1$ through the output transistor $1_1$. This current $IDS1_1$ decreases as the capacitive load $CGS$ is discharged.

Referring to FIG. 3, the gate voltage $VG2_1$ of the drive transistor $2_1$—which corresponds to the gate-source voltage $VGS2_1$ before the gate-source capacitance $CGS1_1$ of the output transistor is charged—increases to a voltage level which is above the level of the biasing voltage $V4_1$ when the electronic switch $3_1$ switches on. That is, $$VG2_1 = V4_1 + \Delta V \qquad (1),$$

where $\Delta V$ is the increase of the gate potential relative to the biasing voltage $V4_1$. This increase $\Delta V$ of the gate voltage $VG2_1$, which is equal $VGS2_1$ at the time of switching on the first electronic switch, results in an increase of the current $IDS2_1$ as compared to a scenario in which the drive transistor $2_1$ is only biased by the biasing voltage $41_1$ The reason for this increase $\Delta V$ in the gate voltage $VG2_1$ is as follows.

Basically, there are two effects that cause the gate voltage $VG2_1$ to increase. The first effect is based on the fact that the gate node $G2_1$ is capacitively coupled to the drain node $D2_1$ through the internal gate-drain capacitance $CGD$. When the first electronic switch $3_1$ switches on, the electrical potential VD2$_1$ at the drain node D2$_1$ of the drive transistor 2$_1$ rises from the first supply potential V1$_1$ to the second supply potential V2$_1$. By virtue of the capacitive coupling of the gate node G2$_1$ to the drain node D2$_1$ the electrical potential at the gate node G2$_1$ increases as the electrical potential VD2$_1$ at the drain node D2$_1$ increases. The internal impedance 42$_1$ of the biasing circuit 4$_1$ prevents the biasing circuit 4$_1$ from instantaneously balancing such increase ΔV of the electrical potential at the gate node G2$_1$ of the drive transistor 2$_1$.

Figure 4:
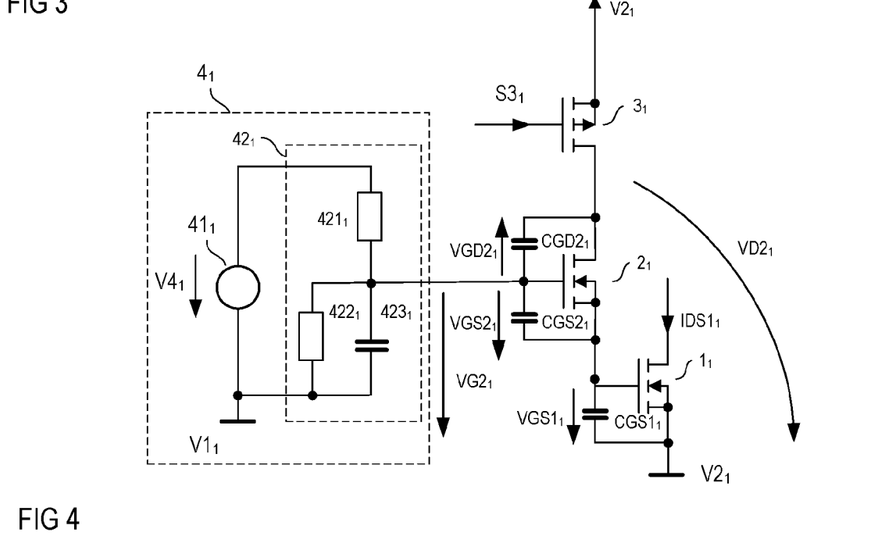
FIG. 4 shows one embodiment of a biasing circuit in the electronic drive circuit.

According to one embodiment, shown in FIG. 4, the internal impedance 42$_1$ of the biasing circuit 4$_1$ includes a parallel circuit with a resistor 422$_1$ and a capacitor 423$_1$ between the gate node G2$_1$ of the drive transistor 2$_1$ and the first supply node 13$_1$. The capacitor 432$_1$ of the biasing circuit 4$_1$ and the gate-drain capacitance CGD2$_1$ of the drive transistor 2$_1$ form a capacitive voltage divider. In the steady state, before the first electronic switch 3$_1$ switches on, the capacitor 423$_1$ of the biasing circuit 4$_1$ has been charged to the biasing voltage V4$_1$ and the gate-drain capacitance CGD2$_1$ has been charged to the biasing voltage V4$_1$. When the electrical potential VD2$_1$ at the drain node increases the gate voltage VG2$_1$ of the drive transistor 2$_1$ increases. It can be shown that right after switching on the first electronic switch 3$_1$ an increase ΔV' of the gate voltage VG2$_1$, as a first approximation, is as follows:

$$\Delta V' = \frac{CGD2_1}{CGD2_1 + C423_1} \cdot (V2_1 - V1_1), \quad (2)$$

where C423$_1$ is the capacitance of the capacitor, CGD2$_1$ is the capacitance value of the gate-drain capacitance. This first approximation neglects the gate-source capacitance CGS2$_1$ of the drive transistor, that is, it is based on the assumption that the capacitive voltage divider between the drain node D2$_1$ and the first supply node only includes the gate-drain capacitance CGD2$_1$ and the capacitor 423$_1$. If, however, the capacitance of the capacitor 423$_1$ is significantly higher than the gate-drain capacitance CGD2$_1$ this assumption is valid. If the gate-source capacitance CGS2$_1$ is taken into account additionally, the voltage increase ΔV' is less than the value obtained by applying equation (2). Referring to equation (2), the voltage difference ΔV' can be adjusted by suitably designing the capacitance C423$_1$ of the capacitor 423$_1$ relative to the capacitance value of the gate-drain capacitance CGD2$_1$.

After switching on the first electronic switch 3$_1$, an increase of the drive transistor's gate potential VG2$_1$ to above the level of the biasing voltage V4$_1$ is not only caused by the increase of the drain potential VG2$_1$ of the drive transistor 2$_1$, but is also caused by an increase of the gate-source voltage VGS1$_1$ of the output transistor 1$_1$. This is a second effect that causes an increase of the gate voltage VG2$_1$. The gate node of the output transistor 1$_1$ is capacitively coupled to the gate node G2$_1$ of the drive transistor 2$_1$ via the gate-source capacitance CGS2$_1$ of the drive transistor 2$_1$, so that an increase of the gate-source voltage VGS1$_1$ of the output transistor 1$_1$ causes an increase of the gate potential VG2$_1$ of the drive transistor 2$_1$. As a first approximation, that neglects the gate-drain capacitance CGD2$_1$, an increase ΔV'' of the gate potential VG2$_1$ resulting from this effect is given as follows:

$$\Delta V'' = \frac{CGS2_1}{CGS2_1 + C423_1} \cdot VGS1_1, \quad (3)$$

where VGS1$_1$ denotes the voltage level of the output transistors gate-source voltage, CGS2$_1$ denotes the capacitance value of the drive transistor's 2$_1$ gate-source capacitance, and C423$_1$ denotes the capacitance of the capacitor 423$_1$ in the biasing circuit 4$_1$. Based on equation (3) it can be seen that by suitably designing the capacitance of the capacitor 423$_1$ relative to the capacitance value of the gate-source capacitance CGS2$_1$ of the drive transistor 2$_1$ the increase ΔV'' of the gate potential VG2$_1$ can be limited.

The overall increase ΔV of the gate voltage VG2$_1$ referred to in equation (1) takes into account both of the effects explained with reference to equations (2) and (3). According to one embodiment, the capacitance C423$_1$ is adapted to capacitance values of the gate-drain capacitance CGD2$_1$ and the gate-source capacitance CGS2$_1$ and to the voltage swings at the drain node D2$_1$ and the source node S2$_1$ of the drive transistor such that overall increase ΔV of the gate voltage VG2$_1$ is between 5% and 25%, in particular between 10% and 20% of the biasing voltage V4$_1$. According to one embodiment, the capacitance C423$_1$ of the capacitor 423$_1$ is at least 10 times, in particular at least 50 times the maximum capacitance value of the gate-drain capacitance CGD2$_1$. According to one embodiment, the capacitance C423$_1$ of the capacitor 423$_1$ is at least 5 times, in particular at least 10 times the maximum capacitance value of the gate-source capacitance CGS2$_1$.

The supply voltage V2$_1$–V1$_1$ between the second supply node 14$_1$ and the first supply node 13$_1$ is higher than the biasing voltage V4$_1$. According to one embodiment, the supply voltage is at least 2 times, at least 3 times, or even at least 5 times the biasing voltage. According to one embodiment, the biasing voltage V4$_1$ is between 2.5V and 3.5V while the supply voltage is 10V or higher.

Referring to FIG. 3 the gate-source voltage VGS1$_1$ of the output transistor 1$_1$ is below the electrical potential VG2$_1$ at the gate node of the drive transistor 2$_1$ because the drive transistor 2$_1$ switches off when the gate-source voltage VGS1$_1$ of the output transistor 1$_1$ reaches a voltage level that equals the electrical potential VG2$_1$ at the gate node G2$_1$ of the drive transistor 2$_1$ minus the threshold voltage of the drive transistor 2$_1$. Thus, the gate-source voltage VGS1$_1$ of the output transistor 1$_1$ is always lower than the biasing voltage V4$_1$ plus the voltage difference ΔV so that the maximum gate-source voltage VGS1$_1$ of the output transistor can be adjusted by suitably designing the biasing circuit 41$_1$ in particular, by suitably selecting the biasing voltage V4$_1$ and the capacitor 423$_1$. In the biasing circuit 4$_1$, the resistor 422$_1$ connected in parallel with the capacitor 423$_1$ discharges the capacitor 423$_1$ so that a voltage level of the gate voltage VG2$_1$ gradually decrease to the level of the biasing voltage V4$_1$. The rate at which the gate potential VG2$_1$ decreases is dependent on the time constant of the parallel circuit with the resistor 422$_1$ and the capacitor 423$_1$. In general, the rate at which the gate potential VG2$_1$ decreases is the higher the lower a resistance R422$_1$ of the resistor 422$_1$ is, and vice versa.

Referring to FIG. 4, the internal impedance 42$_1$ includes a further resistor 421$_1$ connected between the voltage source 41$_1$ and the gate node G2$_1$ of the drive transistor 2$_1$. This further resistor 421$_1$ defines the biasing circuit's 4$_1$ capability to counteract a decrease of the gate potential VG2$_1$ to below the biasing voltage V4$_1$. The lower a resistance R421$_1$ of this resistor 421$_1$ is the faster the biasing circuit 4$_1$ regulates the gate potential V2$_1$ from a level of below the biasing voltage V4$_1$ to a level corresponding to the biasing voltage V4$_1$.

Figure 5:
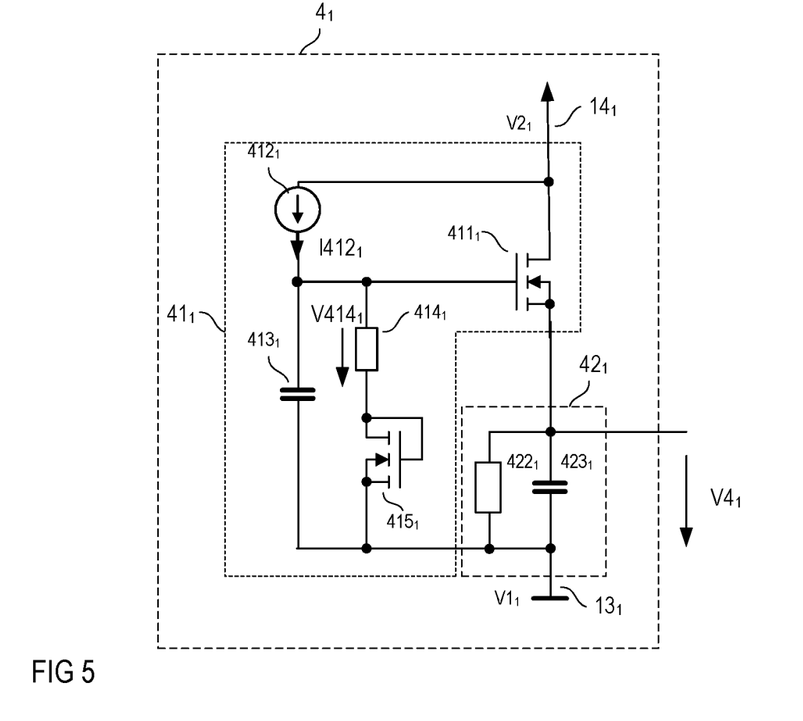
FIG. 5 shows one embodiment of a voltage regulator in the biasing circuit shown in FIG. 4 in greater detail.

FIG. 5 shows one embodiment of the voltage source 41$_1$ in the biasing circuit 4$_1$ in greater detail. In this embodiment, the voltage source 41$_1$ is implemented as a linear voltage regulator connected between the first supply node 13$_1$ and the second supply node 14$_1$. In this embodiment, the voltage regulator includes an output transistor 411$_1$ that has a load path connected between the second supply node 14$_1$ and the parallel circuit with the resistor 422$_1$ and the capacitor 423$_1$. The further resistor 421$_1$ shown in FIG. 4 is defined by the characteristic of the output transistor 411$_1$ in the embodiment shown in FIG. 5. In particular, the resistor is defined by the transconductance, often referred to as gm, of the output transistor 422$_1$. In the embodiment shown in FIG. 5, the output transistor 411$_1$ is implemented as a MOSFET, in particular as an n-type MOSFET. In this voltage regulator 41$_1$, the output transistor 411$_1$ is driven such that, in the steady state, the voltage across the parallel circuit with the resistor 422$_1$ and the capacitor 423$_1$ corresponds to the biasing voltage V4$_1$. This biasing voltage V4$_1$ is defined by a reference current source 412$_1$ and a further resistor 414$_1$. The reference current source 412$_1$ drives a reference current I412$_1$ through the resistor 414$_1$ and a MOSFET 415$_1$ that has its gate node connected to its drain node. A series circuit with the further resistor 414$_1$ and the further transistor 415$_1$ is connected between the gate node of the output transistor 411$_1$ and the first supply node 13$_1$. According to one embodiment a resistance of the further resistor 414$_1$ equals a resistance of the resistor 422$_1$ and the output transistor 411$_1$ and the further transistor 415$_1$ are transistors of the same type, in particular, of the same channel width, the same channel length and the same threshold voltage. In this case, the gate-source voltage of the further transistor 415$_1$ and the gate-source voltage of the output transistor 411$_1$ are equal, and a voltage V414$_1$ across the further resistor corresponds to the biasing voltage V4$_1$. That is, the biasing voltage V4$_1$ is defined by the level of the reference current I412$_1$ multiplied with a resistance R414$_1$ of the further resistor 414$_1$:

$$V414_1 = V4_1 = I412_1 \cdot R414_1 \quad (4).$$

Referring to FIG. 5, a capacitor 413$_1$ may be connected in parallel with the series circuit including the resistor 414$_1$ and the transistor 415$_1$. Referring to the above, the voltage across the series circuit with the resistor 414$_1$ and the transistor 415$_1$ is a reference voltage that drives the transistor and defines the biasing voltage V4$_1$. The gate node of the output transistor 411$_1$ is capacitively coupled with the output of the voltage regulator 41$_1$, that is, with the parallel circuit including the resistor 422$_1$ and the capacitor 423$_1$. Thus, rapid changes of the biasing voltage V4$_1$, such as the increase of the biasing voltage at the time of switching on the first electronic switch 3$_1$, may change the electrical potential at the gate node of the output transistor 411$_1$ and, therefore, the reference voltage if no additional measures are taken. The capacitor 413$_1$ filters such changes of the electrical potential at the gate node of the output transistor 411$_1$ and, therefore, stabilizes the reference voltage.

Figure 6:
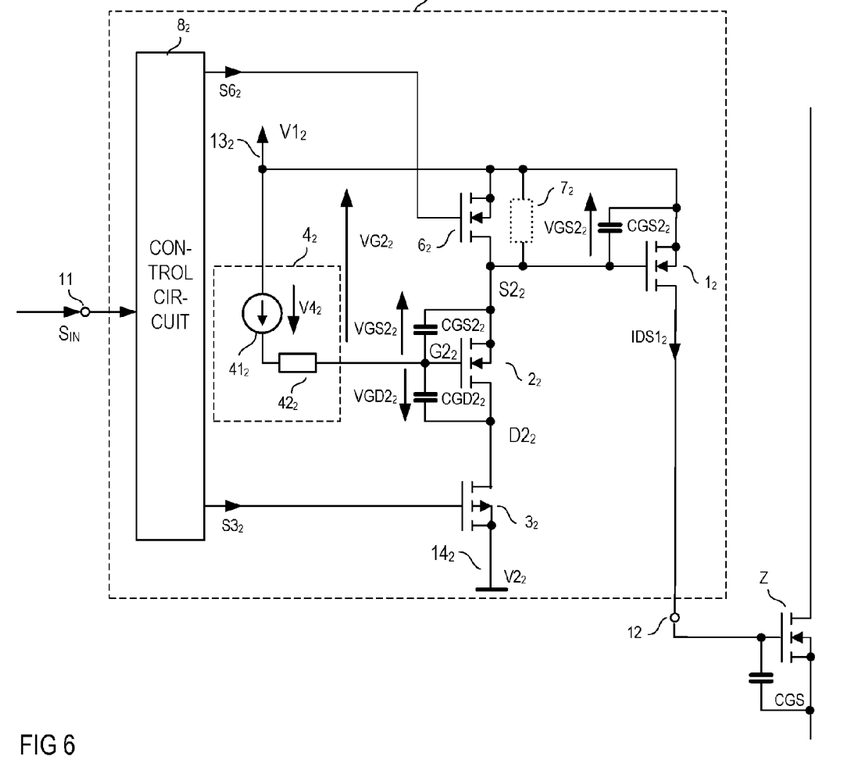
FIG. 6 shows an electronic drive circuit according to another embodiment.

The electronic circuit 1 with the first driver 10$_1$ explained above is configured to discharge a capacitive load CGS connected to output 12. FIG. 6 shows one embodiment of an electronic drive circuit that is configured to charge a capacitive load CGS connected to the output 12 based on an input signal S$_{IN}$. Like in the embodiment shown in FIG. 1, the capacitive load is a gate-source capacitance of a MOSFET Z.

The electronic circuit shown in FIG. 6 includes a driver 10$_2$, which will be referred to as second driver or high-side driver in the following. The tropology of the driver 10$_2$ corresponds to the tropology of the driver 10$_1$ shown in FIG. 1 to which reference is made. In the drivers 10$_1$, 10$_2$ shown in FIGS. 1 and 6 like features have the same reference characters that are only different by a subscript index "1" added to the reference characters in FIG. 1 and a subscript index "2" added to the reference characters in FIG. 6. In particular, the driver 10$_2$ shown in FIG. 6 an output transistor 1$_2$, a drive transistor 2$_2$, and a first electronic switch 3$_2$. The output transistor 1$_2$ includes a control node and a load path connected between the output 12 and a first supply node 13$_2$. The drive transistor 2$_1$ includes a control node, and a load path connected to the control node of the output transistor 1$_2$ and connected in series with the first electronic switch 3$_2$. The first electronic switch 3$_2$ is connected between a second supply node 14$_1$ and the load path of the drive transistor 2$_1$.

The driver 10$_2$ may include a second electronic switch 6$_2$ connected between the control node of the output transistor 1$_2$ and the first supply node 13$_2$. Optionally, a resistor 7$_2$ (illustrated in dashed lines in FIG. 6) is connected in parallel with the second electronic switch 6$_2$ and, therefore, between the control node of the output transistor 1$_2$ and the first supply node 13$_2$.

A biasing circuit 4$_2$ is connected between the control node of the drive transistor 2$_2$ and the first supply node 13$_2$. The biasing circuit 4$_2$ includes a voltage source 41$_2$ configured to provide a biasing voltage V4$_2$, and an internal impedance 42$_2$. A control circuit 5$_2$ is configured to receive the input signal S$_{IN}$ and to drive the first electronic switch 3$_2$ and the second electronic switch 6$_2$ based on the input signal S$_{IN}$.

Figure 7:
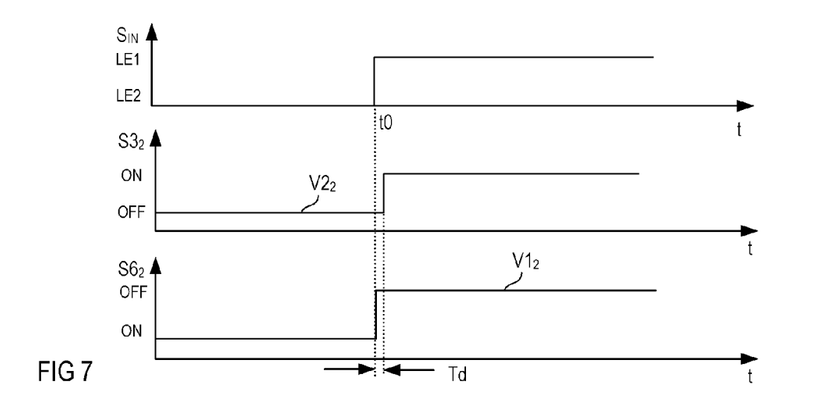
FIG. 7 shows timing diagrams illustrating one way of operation of the electronic drive circuit shown in FIG. 1.

Referring to FIG. 7, which shows timing diagrams of the input Signal S$_{IN}$, a drive signal S3$_2$ of the first electronic switch 3$_2$, and a drive signal S6$_2$ of the second electronic switch 6$_2$. The input signal S$_{IN}$ defines the desired operation state of the load Z driven by the electronic switch 10. For the purpose of illustration, it is assumed that the input signal S$_{IN}$ can have one of two different signal levels, namely a first signal LE1 and a second signal level LE2. The first signal level LE1 indicates that it is desired to switch on the output transistor 1$_2$, so as to charge the capacitive load CGS, and the second signal level LE2 indicates that it is desired to switch off the output transistor 1$_2$. Just for the purpose of illustration, the first level LE1 is a high-level and the second level LE2 is a low-level in the example shown in FIG. 7.

Each of the drive signals S3$_2$, S6$_2$ can have one of an on-level, which switches on the respective electronic switch 3$_2$, 6$_2$, and an off-level, which switches off the respective switch 3$_2$, 6$_2$. When the input signal S$_{IN}$ has the second level LE2 the control circuit 8$_2$ switches off the first electronic switch 3$_2$ by generating an off-level of the drive signal S3$_2$ and switches on the second electronic switch 6$_2$ by generating an on-level of the drive signal S6$_2$. In this operation mode of the first driver 10$_2$ the output transistor 1$_2$ is switched off. When the signal level of the input signal S$_{IN}$ changes from the second level LE2 to the first level LE1 the control circuit 8$_2$ switches off the second electronic switch 6$_2$ by generating an off-level of the drive signal S6$_2$ and, after an optional delay time T$_D$, switches on the first electronic switch 3$_2$, by generating an on-level of the drive signal S3$_2$. In this operation mode of the first driver 10$_2$ the output transistor 1$_2$ is switched on.

The driver 10$_2$ shown in FIG. 6 is different from the driver 10$_1$ shown in FIG. 1 in that the output transistor 1$_2$ and the drive transistor 2$_2$ are p-type MOSFETs, wherein the drain node of the output transistor 1$_2$ is connected to the output 12, and the source node of the drive transistor 2$_2$ is connected to the gate of the output transistor 1$_2$. Further, the first electronic switch 3$_2$ is an n-type MOSFET and the second electronic switch $6_2$ is a p-type MOSFET, wherein a source node of the MOSFET forming the first electronic switch $3_2$ is connected to the second supply node $14_2$. Furthermore, an electrical potential $V1_2$ at the first supply node $13_2$ is higher than an electrical potential $V2_2$ at the second supply node $14_2$.

If, in the driver $10_2$ shown in FIG. 6, the first electronic switch $3_2$ is implemented as an n-type MOSFET, then the off-level of the drive signal $S3_1$ may correspond to the level of the electrically potential $V2_2$ at the second supply node $14_2$, while the on-level may be a signal level that is higher than the electrically potential $V2_2$ at the second supply node $14_2$ plus the threshold voltage of this n-type MOSFET $3_2$. Those signal levels are shown in FIG. 7. If the second electronic switch $6_2$ is a p-type MOSFET, then the off-level of the drive signal $S6_1$ may correspond to the level of the electrical potential $V1_1$ at the first supply node $13_1$, while the on-level may be a signal level that is lower than the electrical potential $V1_2$ at the first supply node $13_2$ minus the threshold voltage of this p-type MOSFET. These signal levels are also shown in FIG. 7.

Everything that has been explained with regard to the functionality of the first driver $10_1$ shown in FIG. 1 applies to the second driver $10_2$ shown in FIG. 6 as well. In particular, at the time of switching on the first switch $3_1$ the magnitude of the gate voltage $VG2_2$ of the drive transistor $2_2$ increases to above the magnitude of the biasing voltage by virtue of the capacitive coupling of the gate node $G2_2$ to the drain node $D2_2$ and the source node $S2_2$, respectively, and by virtue of the internal impedance $42_2$ of the biasing source $4_2$. The biasing source may be implemented as explained with reference to FIGS. 4 and 5 herein below, wherein the output transistor (not shown) in the biasing source $4_2$ may be implemented as a p-type transistor instead of the n-type transistor $411_1$ shown in FIG. 5.

Figure 8:
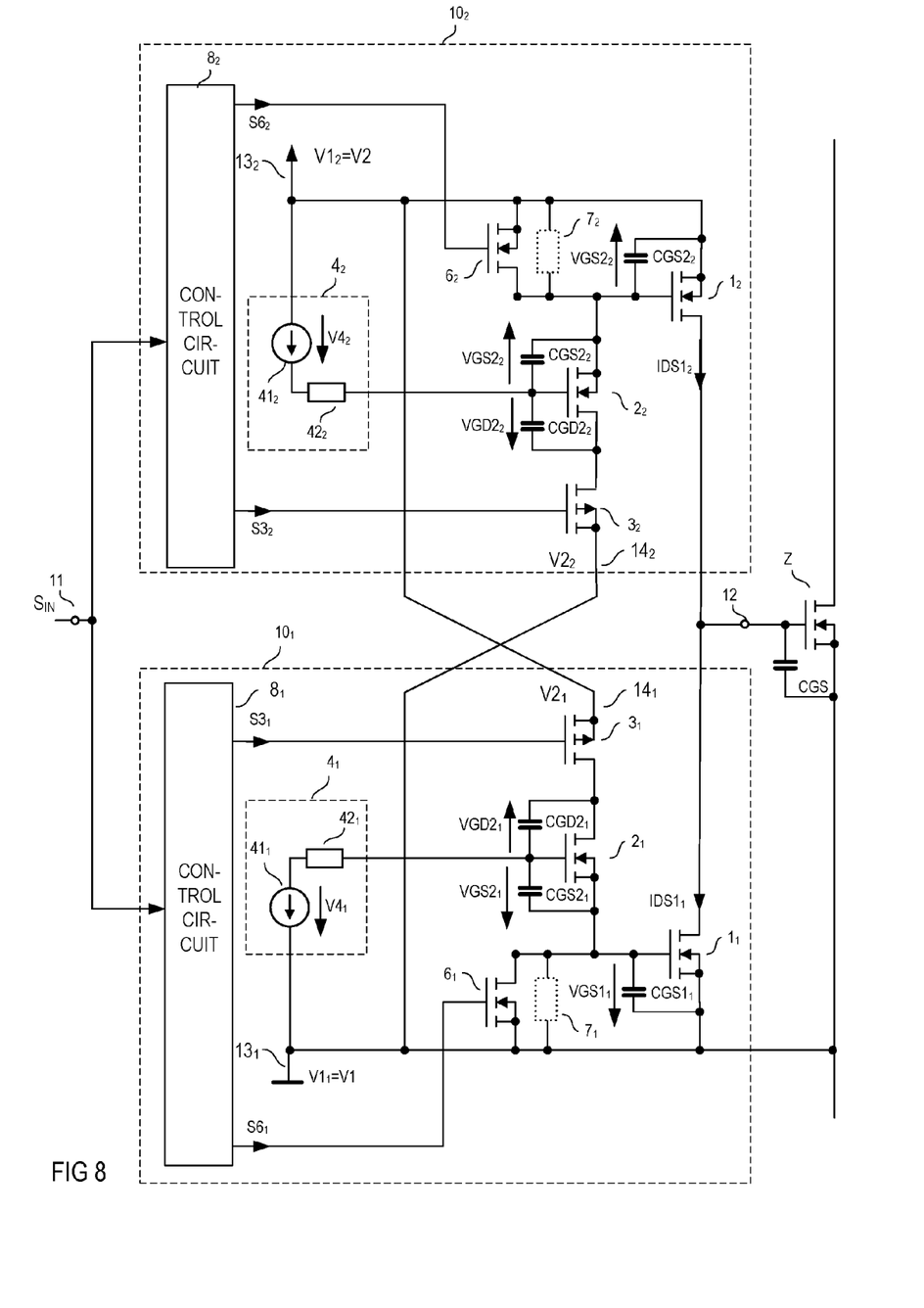
FIG. 8 shows an electronic drive circuit according to yet another embodiment.

FIG. 8 shows one embodiment of an electronic switch that includes a low side driver $10_1$ as shown in FIG. 1 and a high side driver $10_2$ as shown in FIG. 6. This electronic circuit is configured to charge the capacitive load CGS or discharge the capacitive load based on the input signal. In this embodiment, the second supply node $14_1$ of the low side driver $10_1$ is connected to the first supply node $13_2$ of the high side driver $10_2$ so that the second supply potential $V2_1$ of the low-side driver $10_1$ equals the first supply potential $V1_2$ of the high-side driver $10_2$, that is, $V2_1=V1_2=V2$. Furthermore, the second supply node $14_2$ of the high side driver $10_2$ is connected to the first supply node $13_1$ of the low side driver $10_1$ so that the second supply potential $V2_2$ of the high-side driver $10_2$ equals the first supply potential $V1_1$ of the low-side driver, that is, $V2_2=V1_1=V1$. V1 denotes of an electrical potential received at the first supply node $13_1$ (the second supply node 142) of the low side driver $10_1$ (the high side driver $10_2$), and V2 denotes an electrical potential received at the second supply node $14_1$ (the first supply node $13_2$) of the low side driver $10_1$ (the high side driver $10_2$). The electrical potential V1 may correspond to the electrical potential at a load terminal of the capacitive load CGS facing away from the output 12.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
   an input configured to receive an input signal and an output configured to be coupled to a load;
   an output transistor comprising a load path and a control node, the load path being connected between the output and a first supply node;
   a drive transistor comprising a load path and a control node, the load path of the drive transistor being connected to the control node of the output transistor;
   a first electronic switch connected in series with the load path of the drive transistor;
   a biasing circuit comprising an internal impedance and connected between the control node of the drive transistor and the first supply node; and
   a control circuit configured to receive the input signal and to generate a first drive signal for driving the first electronic switch based on the input signal, the first drive signal having an on-level and an off-level which depend on a state of the input signal.

2. The electronic circuit of claim 1, wherein the first electronic switch is connected between the load path of the drive transistor and a second supply node.

3. The electronic circuit of claim 1, further comprising:
   a second electronic switch connected between the control node of the output transistor and the first supply node, wherein the control circuit is configured to generate a second drive signal for driving the second electronic switch based on the input signal, the second drive signal having an on-level and an off-level which depend on the state of the input signal.

4. The electronic circuit of claim 3, wherein the control circuit is configured to drive the first electronic switch and the second electronic switch such that at most one of the first electronic switch and the second electronic switch is driven in an on-state at the same time.

5. The electronic circuit of claim 1, further comprising:
   a resistor connected between the control node of the output transistor and the first supply node.

6. The electronic circuit of claim 1, wherein the internal impedance of the biasing circuit comprises at least one of a resistor and a capacitor connected between the control node of the drive transistor and the first supply node.

7. The electronic circuit of claim 6, wherein the drive transistor has an internal gate-drain capacitance, and wherein a capacitance of the capacitor is at least 10 times a capacitance value of the gate-drain capacitance.

8. The electronic circuit of claim 6, wherein the drive transistor has an internal gate-source capacitance, and wherein a capacitance of the capacitor is at least 5 times a capacitance value of the gate-source capacitance.

9. The electronic circuit of claim 1, wherein the output transistor and the drive transistor have the same conductivity type.

10. The electronic circuit of claim 9, wherein the first electronic switch is implemented as a transistor of a conductivity type complementary to the conductivity type of the output transistor and the drive transistor.

11. The electronic circuit of claim 1, wherein the biasing circuit further comprises a voltage regulator having a supply input connected between the first supply node and a second supply node, and having an output coupled to the control node of the drive transistor.

12. The electronic circuit of claim 2, wherein the first supply node is configured to receive a first electrical potential and the second supply node is configured to receive a second electrical potential higher than the first electrical potential, wherein each of the output transistor and the drive transistor is an n-type MOSFET, and wherein the first electronic switch is a p-type MOSFET.

13. The electronic circuit of claim 2, wherein the first supply node is configured to receive a first electrical potential and the second supply node is configured to receive a second electrical potential lower than the first electrical potential, wherein each of the output transistor and the drive transistor is a p-type MOSFET, and wherein the first electronic switch is an n-type MOSFET.

14. The electronic circuit of claim 2, further comprising:
a further output transistor comprising a load path and a control node, the load path being connected between the output and a third supply node;
a further drive transistor comprising a load path and a control node, the load path being connected to the control node of the further output transistor;
a further first electronic switch connected in series with the load path of the further drive transistor;
a further biasing circuit comprising an internal impedance and connected between the control node of the further drive transistor and the third supply node; and
a further control circuit configured to receive the input signal and to drive the further first electronic switch based on the input signal.

15. The electronic circuit of claim 14, wherein the further first electronic switch is connected between the load path of the further drive transistor and a fourth supply node.

16. The electronic circuit of claim 15, wherein the first supply node and the fourth supply node are connected and the second supply node and the third supply node are connected.

17. The electronic circuit of claim 14, further comprising:
a further second electronic switch connected between the control node of the output transistor and the third supply node,
wherein the further control circuit is configured to drive the second electronic switch based on the input signal.

18. The electronic circuit of claim 17, wherein the control circuit is configured to drive the further first electronic switch and the further second electronic switch such that at most one of the further first electronic switch and the further second electronic switch is driven in an on-state at the same time.

19. The electronic circuit of claim 14, further comprising:
a further resistor connected between the control node of the further output transistor and the third supply node.

20. An electronic circuit, comprising:
an input configured to receive an input signal and an output configured to be coupled to a load;
an output transistor comprising a load path and a control node, the load path being connected between the output and a first supply node;
a drive transistor comprising a load path and a control node, the load path of the drive transistor being connected to the control node of the output transistor;
a first electronic switch connected in series with the load path of the drive transistor;
a biasing circuit comprising an internal impedance and connected between the control node of the drive transistor and the first supply node; and
a control circuit configured to receive the input signal and to drive the first electronic switch based on the input signal,
wherein the biasing circuit further comprises a voltage regulator having a supply input connected between the first supply node and a second supply node, and having an output coupled to the control node of the drive transistor.

* * * * *